US012750968B2

(12) United States Patent
Lin et al.

(10) Patent No.: US 12,750,968 B2
(45) Date of Patent: Sep. 29, 2026

(54) ELECTRONIC DEVICE AND BUFFERING MECHANISM

(71) Applicant: Wistron Corporation, New Taipei City (TW)

(72) Inventors: Chunmei Lin, New Taipei City (TW); Xiao-Yi Cai, New Taipei City (TW); Zhong-Hui Mao, New Taipei City (TW); Chih Yao Chou, New Taipei City (TW); Hai-Nan Qiu, New Taipei City (TW)

(73) Assignee: Wistron Corporation, New Taipei City (TW)

( * ) Notice: Subject to any disclaimer, the term of this patent is extended or adjusted under 35 U.S.C. 154(b) by 111 days.

(21) Appl. No.: 18/798,751

(22) Filed: Aug. 8, 2024

(65) Prior Publication Data

US 2025/0374469 A1 Dec. 4, 2025

(30) Foreign Application Priority Data

May 30, 2024 (CN) ......................... 202410697149.3

(51) Int. Cl.
*H05K 7/14* (2006.01)
*H05K 5/02* (2006.01)

(52) U.S. Cl.
CPC ........... *H05K 7/1487* (2013.01); *H05K 5/023* (2013.01)

(58) Field of Classification Search
CPC .... H01R 13/62; H01R 13/629; H01R 13/631; H01R 13/633; H05K 7/14; H05K 7/1401
See application file for complete search history.

(56) References Cited

U.S. PATENT DOCUMENTS

| | | | | | |
|---|---|---|---|---|---|
| 3,853,379 | A * | 12/1974 | Goodman | H05K 7/1409 | 361/801 |
| 5,269,698 | A * | 12/1993 | Singer | H05K 7/1409 | 439/157 |
| 5,717,570 | A * | 2/1998 | Kikinis | G06F 1/184 | 361/679.57 |
| 6,252,514 | B1 * | 6/2001 | Nolan | G11B 33/128 | 361/170 |
| 6,288,902 | B1 * | 9/2001 | Kim | G11B 33/08 | 206/707 |
| 7,245,499 | B2 * | 7/2007 | Stahl | H05K 7/1409 | 361/740 |

(Continued)

FOREIGN PATENT DOCUMENTS

| | | |
|---|---|---|
| CN | 103068204 | 4/2013 |
| TW | 202046848 | 12/2020 |

*Primary Examiner* — Adrian S Wilson
(74) *Attorney, Agent, or Firm* — JCIPRNET

(57) ABSTRACT

An electronic device includes a device body, an electronic module, a buffering assembly, and a handle assembly. The device body has a stopping part. The electronic module is detachably disposed in the device body in a sliding direction. The buffering assembly is slidably disposed on the electronic module along the sliding direction. The stopping part stops the buffering assembly on the electronic module. The handle assembly is pivotably disposed on the electronic module and coupled to the buffering assembly. Based on a force applied to the handle assembly in the sliding direction, the buffering assembly is separated from the stopping part, and the electronic module is plugged in the device body. A buffering mechanism is also disclosed.

20 Claims, 14 Drawing Sheets

(56) References Cited

U.S. PATENT DOCUMENTS

| | | | | |
|---|---|---|---|---|
| 7,281,937 | B2 * | 10/2007 | Reed | H01R 13/6275 439/352 |
| 8,837,137 | B2 | 9/2014 | Yin et al. | |
| 9,022,434 | B2 * | 5/2015 | Crippen | H05K 7/1487 292/194 |
| 10,939,574 | B2 | 3/2021 | Wu et al. | |
| 11,930,614 | B2 | 3/2024 | Lin | |
| 2003/0003787 | A1 * | 1/2003 | Bakker | H01R 13/4538 439/157 |
| 2004/0077198 | A1 * | 4/2004 | Schlack | H05K 7/1409 439/160 |
| 2004/0264146 | A1 * | 12/2004 | Kerrigan | H05K 7/1489 361/726 |
| 2005/0030721 | A1 * | 2/2005 | Shimada | G06F 1/181 |
| 2007/0188999 | A1 * | 8/2007 | Strmiska | H05K 7/1409 361/798 |
| 2007/0217142 | A1 * | 9/2007 | Wagatsuma | G06F 1/181 361/679.37 |
| 2013/0100593 | A1 | 4/2013 | Yin et al. | |
| 2016/0374227 | A1 * | 12/2016 | Zou | H05K 7/1489 |
| 2020/0396858 | A1 | 12/2020 | Wu et al. | |
| 2025/0247991 | A1 * | 7/2025 | Xu | H05K 7/1487 |
| 2025/0354599 | A1 * | 11/2025 | Mao | H05K 7/1487 |

* cited by examiner

ELECTRONIC DEVICE AND BUFFERING MECHANISM

CROSS-REFERENCE TO RELATED APPLICATION

This application claims the priority benefit of China application serial no. 202410697149.3, filed on May 30, 2024. The entirety of the above-mentioned patent application is hereby incorporated by reference herein and made a part of this specification.

BACKGROUND

Technical Field

This disclosure relates to an electronic device, and in particular to an electronic device having a buffering mechanism.

Description of Related Art

With the rapid development of artificial intelligence and deep learning, the performance of servers continues to increase, making the electronic modules in servers larger and heavier. However, since there is no buffering mechanism between the electronic modules and the device body of the servers on the market today, the connectors and motherboards of the electronic modules are susceptible to damage due to the impact of the large and heavy electronic modules during the installation process. Thus, how to avoid damage to the connector of the electronic module and the motherboard of the server during the installation process may be a topic that this field is dedicated to exploring.

SUMMARY

The disclosure provides an electronic device and a buffering mechanism to prevent an electronic module and a device body from being damaged due to collision during an installation process, and allows the electronic module to be installed conveniently.

The electronic device of the disclosure includes a device body, an electronic module, a buffering assembly, and a handle assembly. The device body has a stopping part. The electronic module is detachably disposed on the device body in a sliding direction. A buffering assembly is slidably disposed on the electronic module in the sliding direction, and the stopping part is disposed on the buffering assembly on the electronic module. The handle assembly is pivoted on the electronic module and coupled to the buffering assembly. Based on a force applied to the handle assembly in the sliding direction, the buffering assembly is separated from the stopping part, and the electronic module is plugged in the device body.

A buffering mechanism of the disclosure includes a main body, a buffering assembly, a stopping part, and a handle assembly. The buffering assembly is slidably disposed on the main body in a sliding direction. The stopping part is disposed on the buffering assembly on the main body. The handle assembly is pivoted on the main body and coupled to the buffering assembly. The handle assembly has a guide slope. Based on a force applied to the handle assembly in the sliding direction, the buffering assembly is separated from the stopping part by guidance of the guide slope.

An electronic device of the disclosure includes a device body, an electronic module, a buffering assembly, and a handle assembly. The device body has a stopping part. The electronic module is detachably disposed on the device body in a sliding direction. A buffering assembly is slidably disposed on the electronic module in the sliding direction, and the stopping part is disposed on the buffering assembly on the electronic module. The handle assembly is pivoted on the electronic module and coupled to the buffering assembly. The handle assembly has a guide slope. Based on a force applied to the handle assembly in the sliding direction, the buffering assembly is separated from the stopping part by guidance of the guide slope.

In an embodiment of the disclosure, the electronic module has an opening, the stopping part corresponds to the opening, and the buffering assembly is stopped by the stopping part through the opening.

In an embodiment of the disclosure, the buffering assembly includes a buffering member and at least one elastic member. The buffering member is slidably disposed on the electronic module in the sliding direction, and the at least one elastic member is connected between the buffering member and the electronic module.

In an embodiment of the disclosure, the buffering assembly includes a buffering hook and a buffering member. The buffering member is slidably disposed on the electronic module in the sliding direction. The buffering hook is pivotally connected to the buffering member and configured to be stopped by the stopping part.

In an embodiment of the disclosure, the buffering assembly further includes an elastic member. The elastic member is disposed between the buffering hook and the buffering member. The buffering hook is maintained at a stop position by an elastic force of the elastic member and is stopped by the stopping part.

In an embodiment of the disclosure, the handle assembly includes a handle and a connecting rod, the handle is movably connected to one end of the connecting rod, and the buffering assembly rests on the other end of the connecting rod.

In an embodiment of the disclosure, the connecting rod has a slide groove. The slide groove includes a first section and a second section. The first section and the second section extend in different directions respectively. The handle has a protruding post. The protruding post is slidably disposed in the slide groove and is adapted to slide along the first section and the second section in sequence.

In an embodiment of the disclosure, the connecting rod has a guide slope. The buffering assembly is separated from the stopping part by guidance of the guide slope.

In an embodiment of the disclosure, the main body has an opening, the stopping part corresponds to the opening, and the buffering assembly is stopped by the stopping part through the opening.

In an embodiment of the disclosure, the buffering assembly includes a buffering member and at least one elastic member, the buffering member is slidably disposed on the main body in the sliding direction, and the at least one elastic member is connected between the buffering member and the main body.

In an embodiment of the disclosure, the buffering assembly includes a buffering hook and a buffering member, the buffering member is slidably disposed on the main body along in the sliding direction, and the buffering hook is pivotally connected to the buffering member and configured to be stopped by the stopping part.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate example embodiments of the disclosure and, together with the description, serve to explain the principles of the disclosure.

DESCRIPTION OF THE EMBODIMENTS

Figure 1:
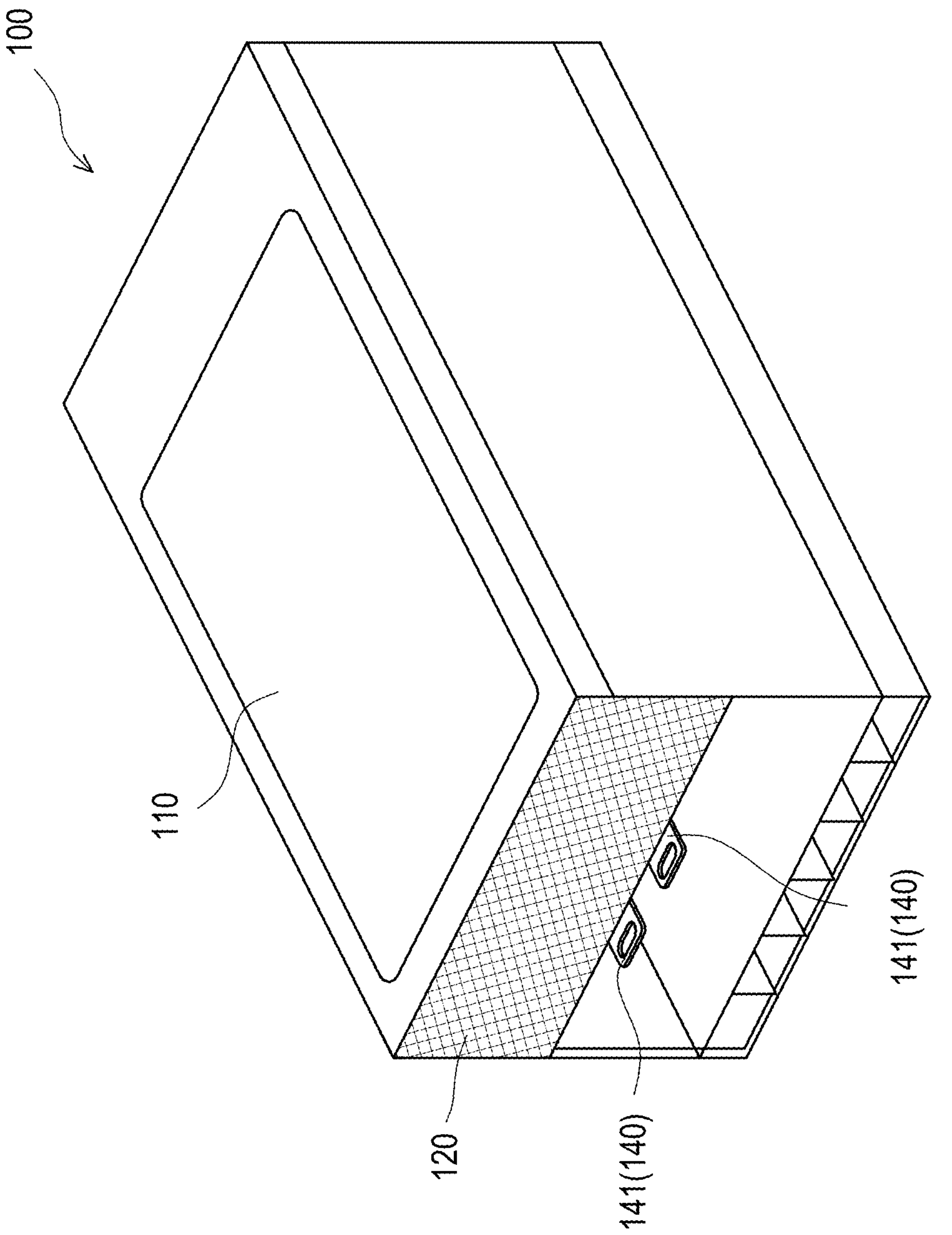
FIG. 1 is a schematic view of an electronic device according to an embodiment of the disclosure.
Figure 2:
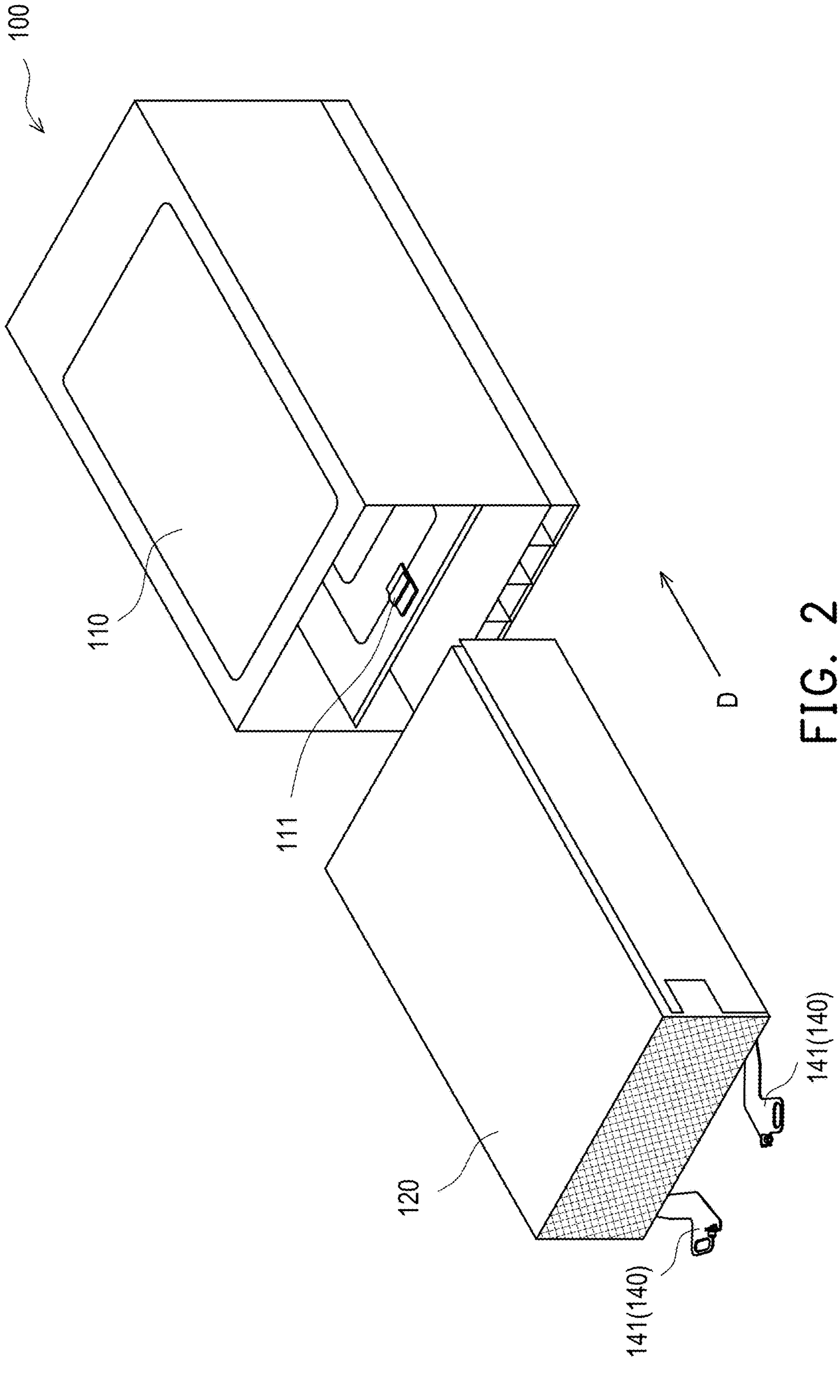
FIG. 2 shows an electronic module in FIG. 1 being disassembled from a device body.
Figure 3:
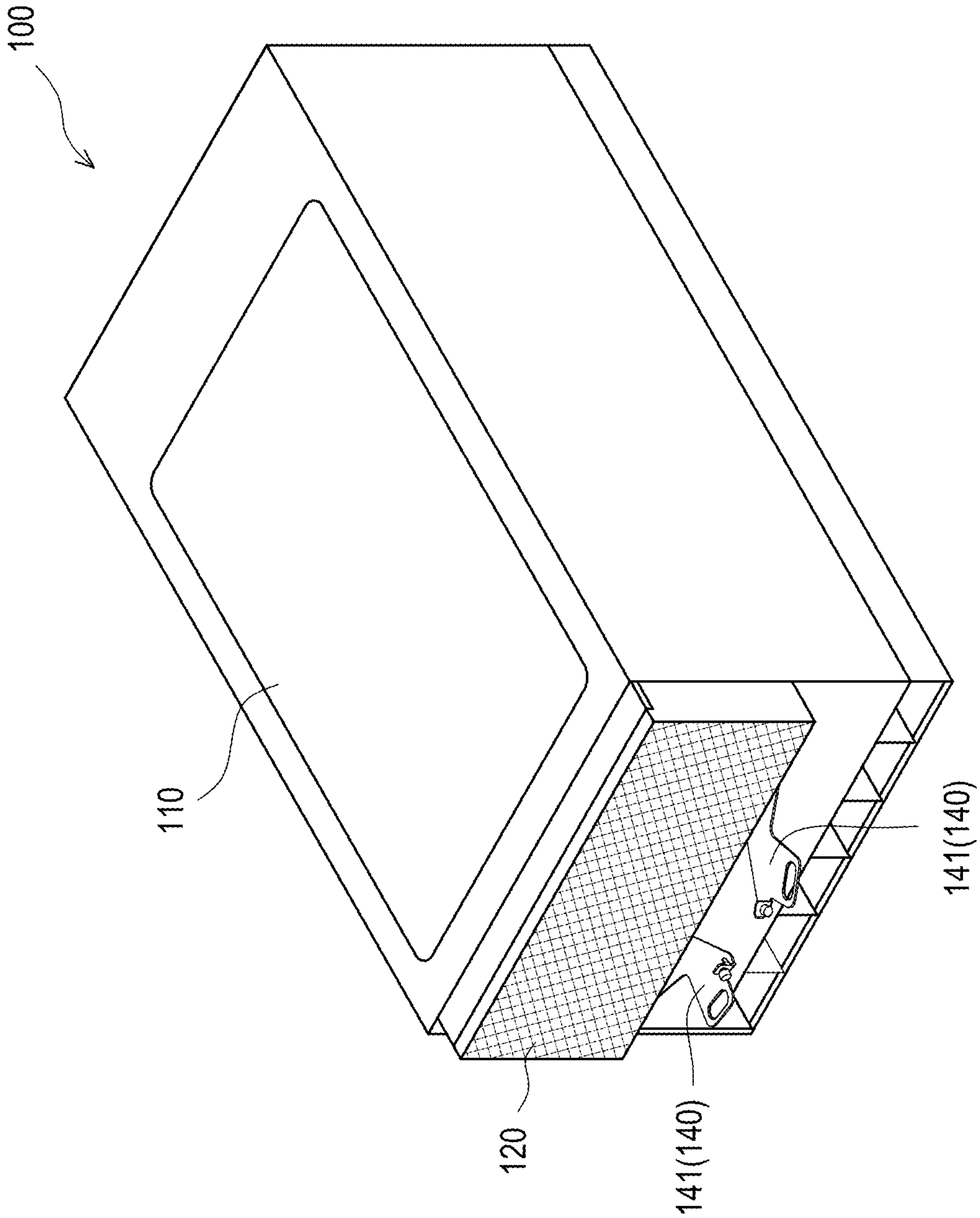
FIG. 3 shows the electronic module in FIG. 2 moving to a first position.

FIG. 1 is a schematic view of an electronic device according to an embodiment of the disclosure. FIG. 2 shows an electronic module in FIG. 1 being disassembled from a device body. FIG. 3 shows the electronic module in FIG. 2 moving to a first position. Referring to FIG. 1 to FIG. 3, an electronic device 100 in this embodiment is, for example, a server, including a device body 110 and an electronic module 120. The electronic module 120 is, for example, a GPU module, detachably disposed on the device body 110 in a sliding direction D.

Figure 4:
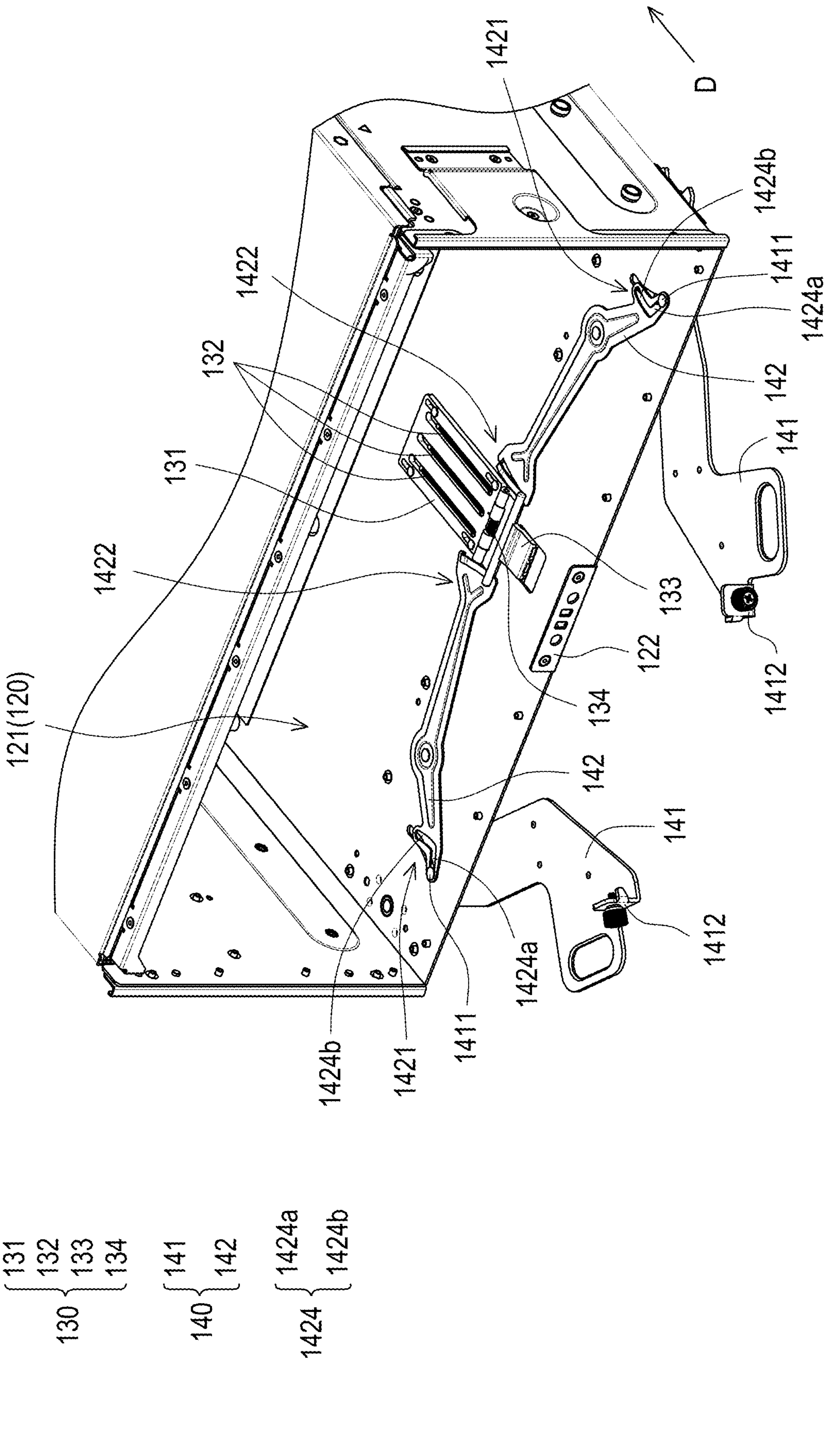
FIG. 4 is a partial component diagram of the electronic device in FIG. 1.

FIG. 4 is a partial component diagram of the electronic device in FIG. 1. Referring to FIG. 1 and FIG. 4, the electronic device 100 further includes a buffering assembly 130 and two handle assemblies 140. The device body 110 has a stopping part 111 as shown in FIG. 2. The buffering assembly 130 is slidably disposed in the sliding direction D on the electronic module 120, and the stopping part 111 is disposed on the buffering assembly 130 on the electronic module 120 at a first position as shown in FIG. 3. The two handle assemblies 140 are pivoted on the electronic module 120 and coupled to the buffering assembly 130. In this embodiment, a partial housing 121, the stopping part 111, the buffering assembly 130, and the two handle assemblies 140 of the electronic module 120 constitute a buffering mechanism, in which the partial housing 121 of the electronic module 120 is a main body of the buffering mechanism.

In the electronic device 100 of this embodiment, when the electronic module 120 is installed on the device body 110, the electronic module 120 slows down and stops at the first position due to mutual stopping of the buffering assembly 130 disposed on the electronic module 120 and the stopping part 111 of the device body 110, so as to prevent the electronic module 120 and the device body 110 from being damaged due to collision during an installation process. Then, a user may push the handle assembly 140 so that the electronic device 100, based on a force applied to the two handle assemblies 140 in the sliding direction D, causes the buffering assembly 130 to separate from the stopping part 111 to release the stopping between the buffering assembly 130 and the stopping part 111, which in turn allows the electronic module 120 to be moved from the first position to a second position as shown in FIG. 1, and plugged in the device body 110. In other words, in the process of pushing the handle assembly 140 by the user, the stopping may be released and the electronic module 120 may be connected to the device body 110, and such an operation mechanism enables the electronic module 120 to be conveniently installed.

In this embodiment, the stopping part 111 is fixed to the device body 110 through rivets, for example, but the disclosure is not limited thereto.

In this embodiment, the electronic module 120 may slide relative to the device body 110 through a roller (not shown) slidably disposed on a rail (not shown) of the device body 110, but the disclosure is not limited thereto.

A structure of the buffering assembly 130 is described in detail below.

Figure 5:
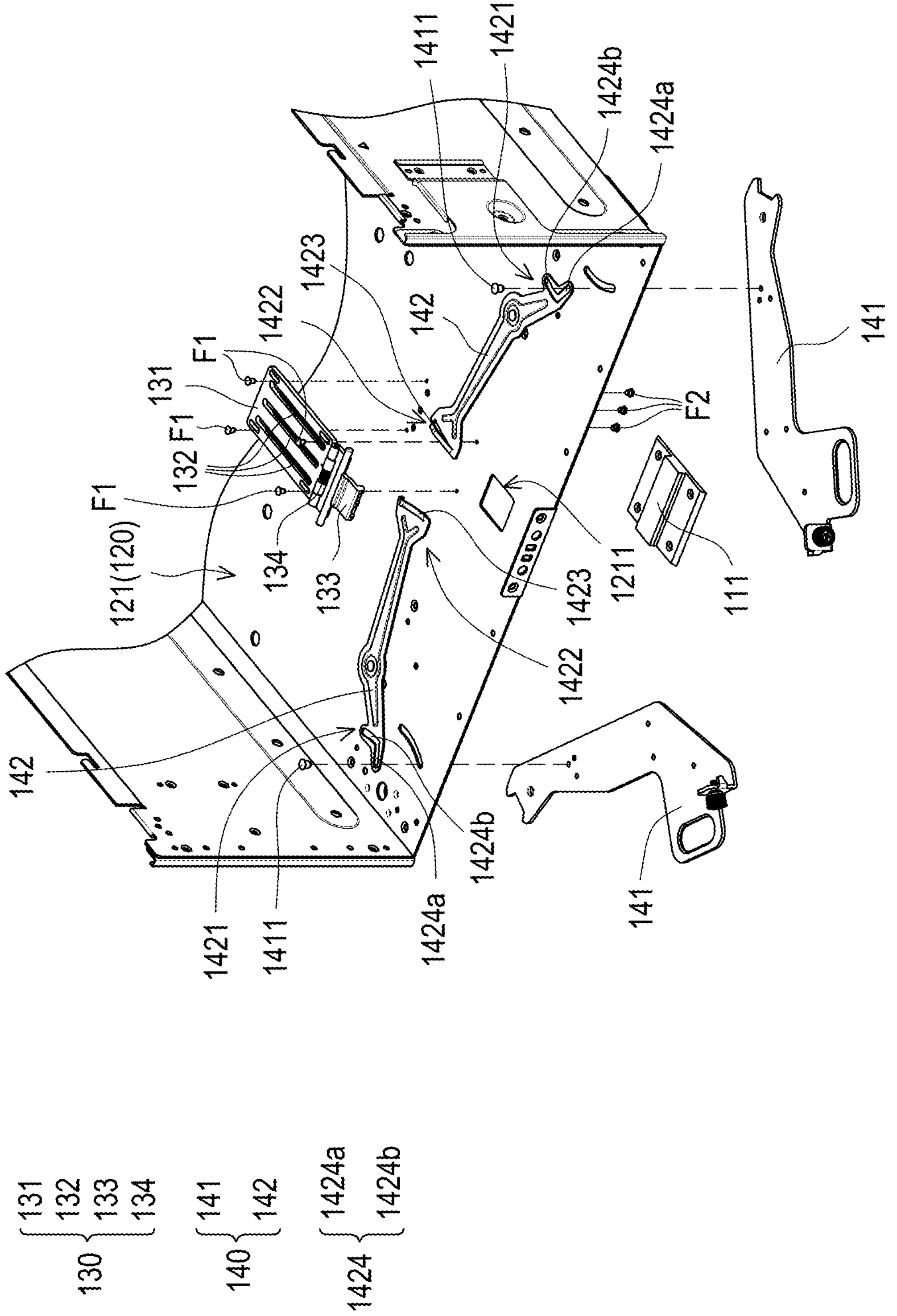
FIG. 5 is an exploded view of a buffering mechanism of FIG. 4.
Figure 6A:
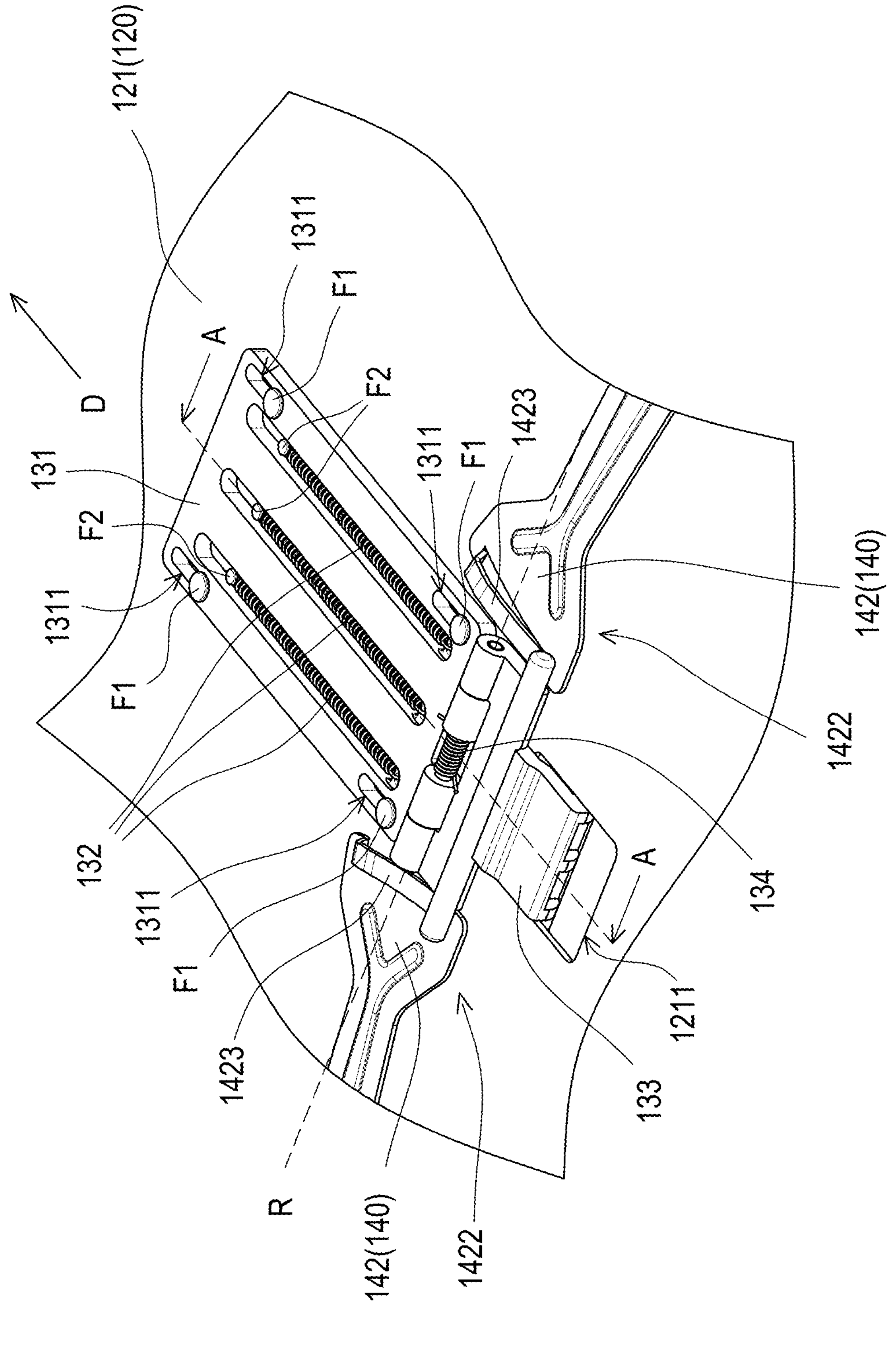
FIG. 6A is a partial enlarged view of the buffering mechanism of FIG. 4.
Figure 6B:
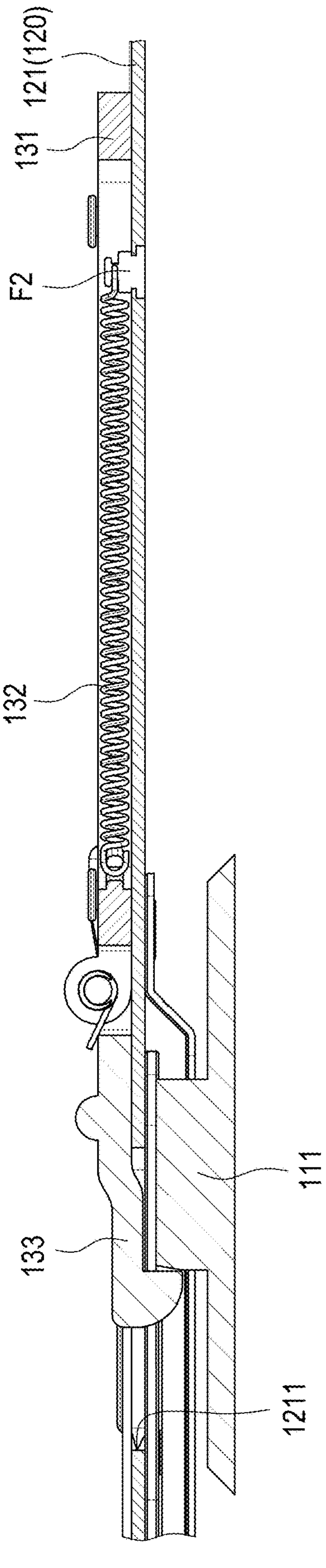
FIG. 6B is a cross-sectional view along a line A-A of the buffering mechanism of FIG. 6A.

FIG. 5 is an exploded view of a buffering mechanism of FIG. 4. FIG. 6A is a partial enlarged view of the buffering mechanism of FIG. 4. FIG. 6B is a cross-sectional view along a line A-A of the buffering mechanism of FIG. 6A. Referring to FIG. 5, FIG. 6A, and FIG. 6B, the main body of the electronic module 120 in this embodiment has an opening 1211, the stopping part 111 corresponds to the opening 1211, and the buffering assembly 130 is stopped by the stopping part 111 through the opening 1211. In detail, the buffering assembly 130 includes a buffering member 131, multiple elastic members 132, a buffering hook 133, and an elastic member 134. The buffering member 131 is slidably disposed on the main body of the electronic module 120 in the sliding direction D. One end of each elastic member 132 is connected to the buffering member 131, and the other end of the each elastic member 132 is fixed to the main body of the electronic module 120 through a second fixing post F2. The buffering hook 133 is pivotally connected to the buffering member 131 and is stopped by the stopping part 111 through the opening 1211. The elastic member 134 is, for example, a torsion spring, but is not limited thereto. The elastic member 134 is disposed between the buffering hook 133 and the buffering member 131. The buffering hook 133 is maintained at a stopping position as shown in FIG. 6A by an elastic force of the elastic member 134 and is stopped by the stopping part 111 (shown in FIG. 6B).

In this embodiment, the buffering member 131 has four slide grooves 1311 extending in the sliding direction D as shown in FIG. 6A, four first fixing posts F1 are respectively penetrated through the slide grooves 1311 and fixed to the main body of the electronic module 120, and the groove 1311 may move relative to the first fixing post F1 in the sliding direction D, but the disclosure is not limited thereto.

Referring to FIG. 6A, in this embodiment, the elastic members 132 are disposed in the sliding direction D. The elastic members 132 are, for example, tension springs, and a quantity of the elastic members 132 is three. However, the disclosure does not limit the direction, type, and quantity of the elastic members 132.

Referring to FIG. 6A, the buffering hook 133 of this embodiment may rotate relative to the buffering member 131 along a rotation axis R. The rotation axis R is perpendicular to the sliding direction D. However, the disclosure does not limit the relative relationship between the rotation axis R and the sliding direction D.

A structure of the handle assembly 140 is described in detail below.

Referring to FIG. 4 and FIG. 5, each handle assembly 140 includes a handle 141 and a connecting rod 142. The handle 141 is movably connected to one end 1421 of the connecting rod 142. The buffering assembly 130 rests on the other end 1422 of the connecting rod 142 as shown in FIG. 6A. The connecting rod 142 has a guide slope 1423 as shown in FIG. 6A, the guide slope 1423 is located at the other end 1422 of the connecting rod 142, and both sides of the buffering hook 133 of the buffering assembly 130 correspond to the two guide slopes 1423.

Referring to FIG. 5, the connecting rod 142 further has a slide groove 1424. The slide groove 1424 includes a first section 1424*a* and a second section 1424*b*. The first section 1424*a* and the second section 1424*b* respectively extend in different directions. The handle 141 has a protruding post 1411. The protruding post 1411 is slidably disposed in the slide groove 1424 and is adapted to slide along the first section 1424*a* and the second section 1424*b* in sequence. A buffering process of the buffering assembly 130 is described in detail below.

Figure 7:
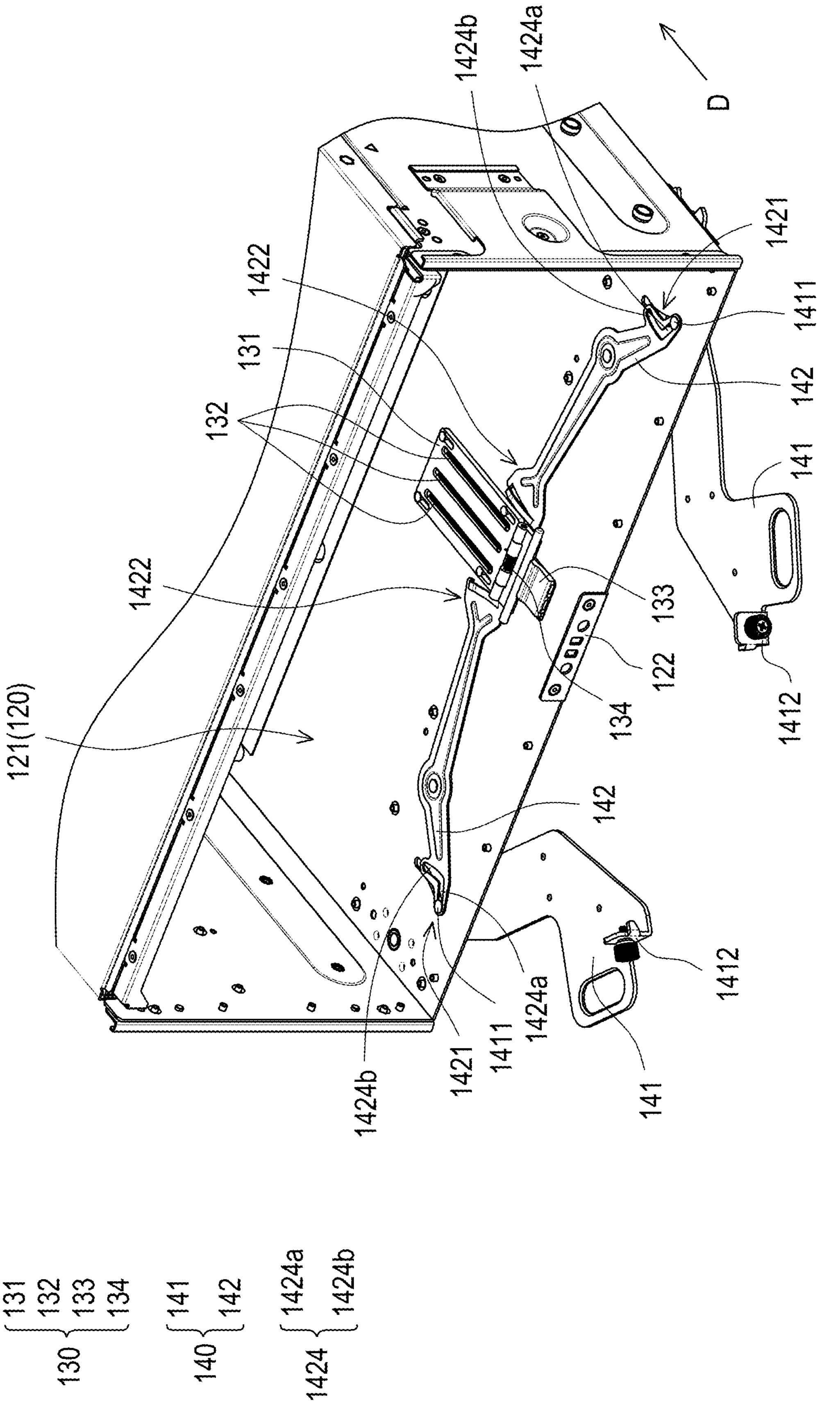
FIG. 7 shows a main body of an electronic module in FIG. 4 moving relative to a buffering assembly.
Figure 8:
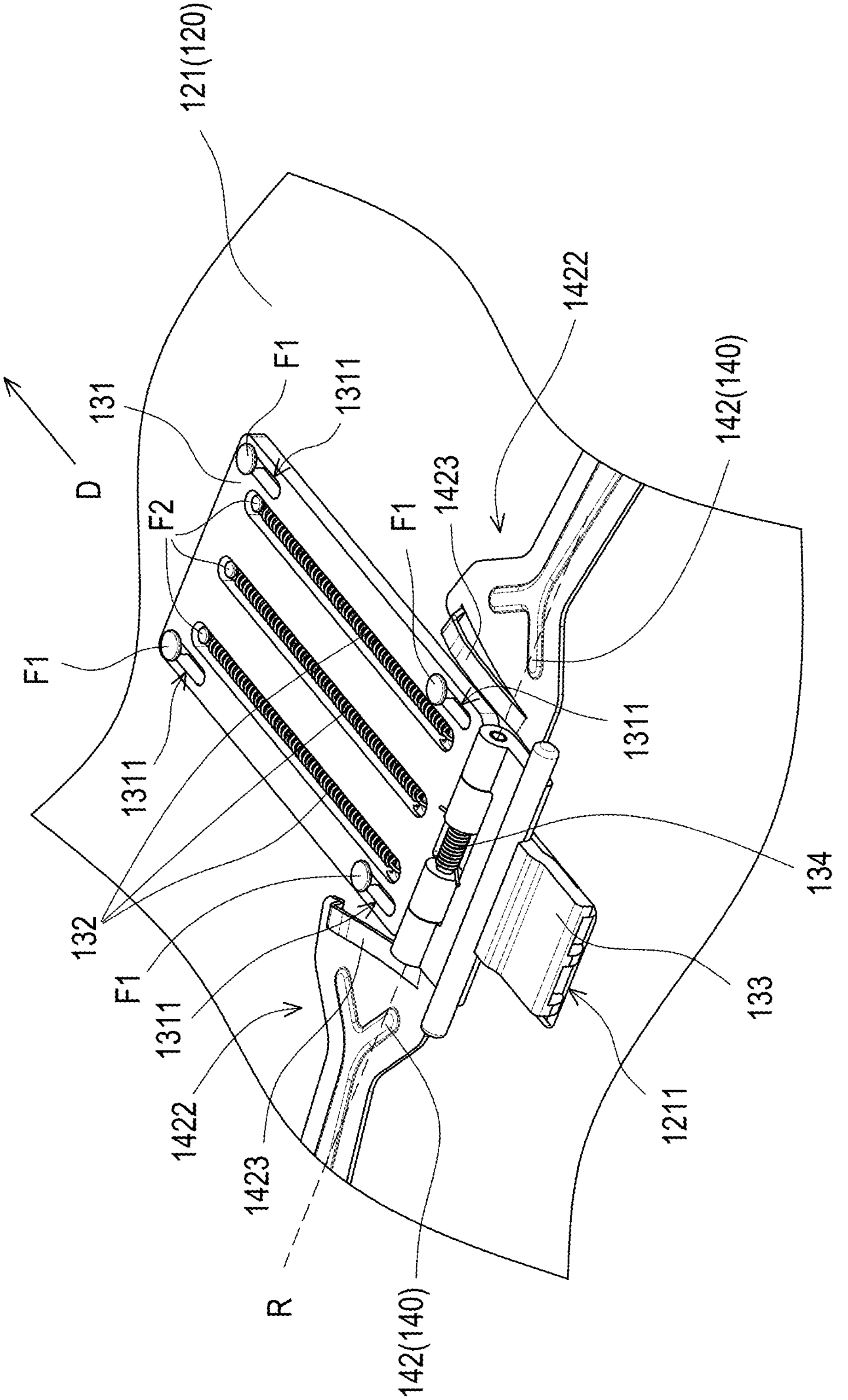
FIG. 8 is a partial enlarged view of a buffering mechanism of FIG. 7.

FIG. 7 shows a main body of an electronic module in FIG. 4 moving relative to a buffering assembly. FIG. 8 is a partial enlarged view of a buffering mechanism of FIG. 7. Please refer to FIG. 6A, FIG. 7, and FIG. 8. During the process of the user setting the electronic module 120 to the device body 110 in the sliding direction D, the buffering member 130 is stopped by the stopping part 111 from the position as shown in FIG. 6A. Then, as the electronic module 120 continues to move in the sliding direction D, the main body of the electronic module 120 moves from the position shown in FIG. 6A to a position shown in FIG. 8 relative to the buffering member 131 due to the stopping of the buffering member 130 by the stopping part 111, and stretches the elastic members 132 at the same time, so that kinetic energy of the electronic module 120 is gradually converted into elastic potential energy of the elastic members 132, which in turn causes the electronic module 120 to buffer and stop at the first position shown in FIG. 3. Next, the user may push the handle assembly 140 to move the electronic module 120 to the second position as shown in FIG. 1, while plugging in the device body 110.

The following specifies action between the buffering assembly 130 and the handle assembly 140 when a force is applied to the handle assembly 140.

Figure 9:
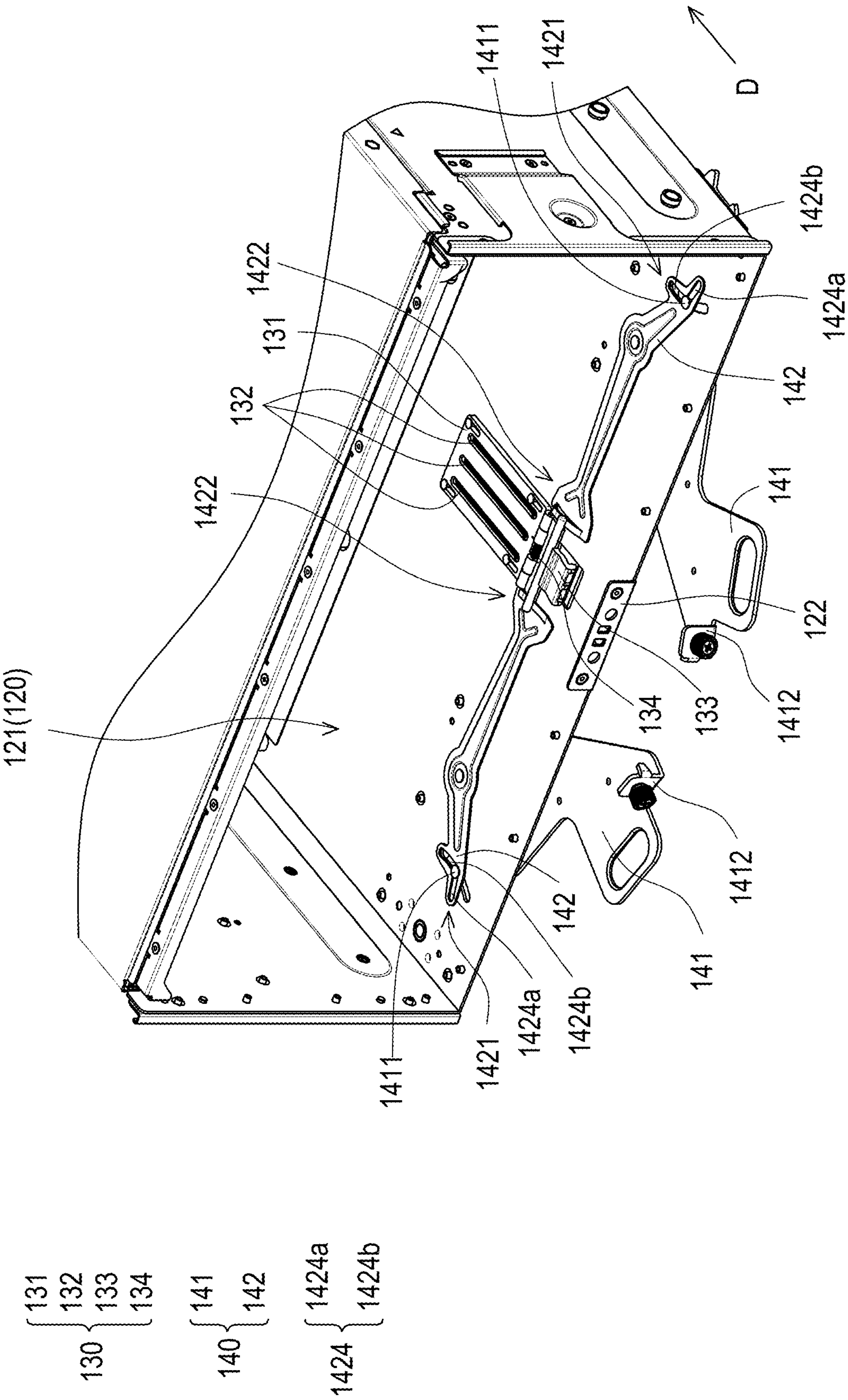
FIG. 9 shows a handle of FIG. 7 moving and a buffering hook separated from a stopping part.
Figure 10:
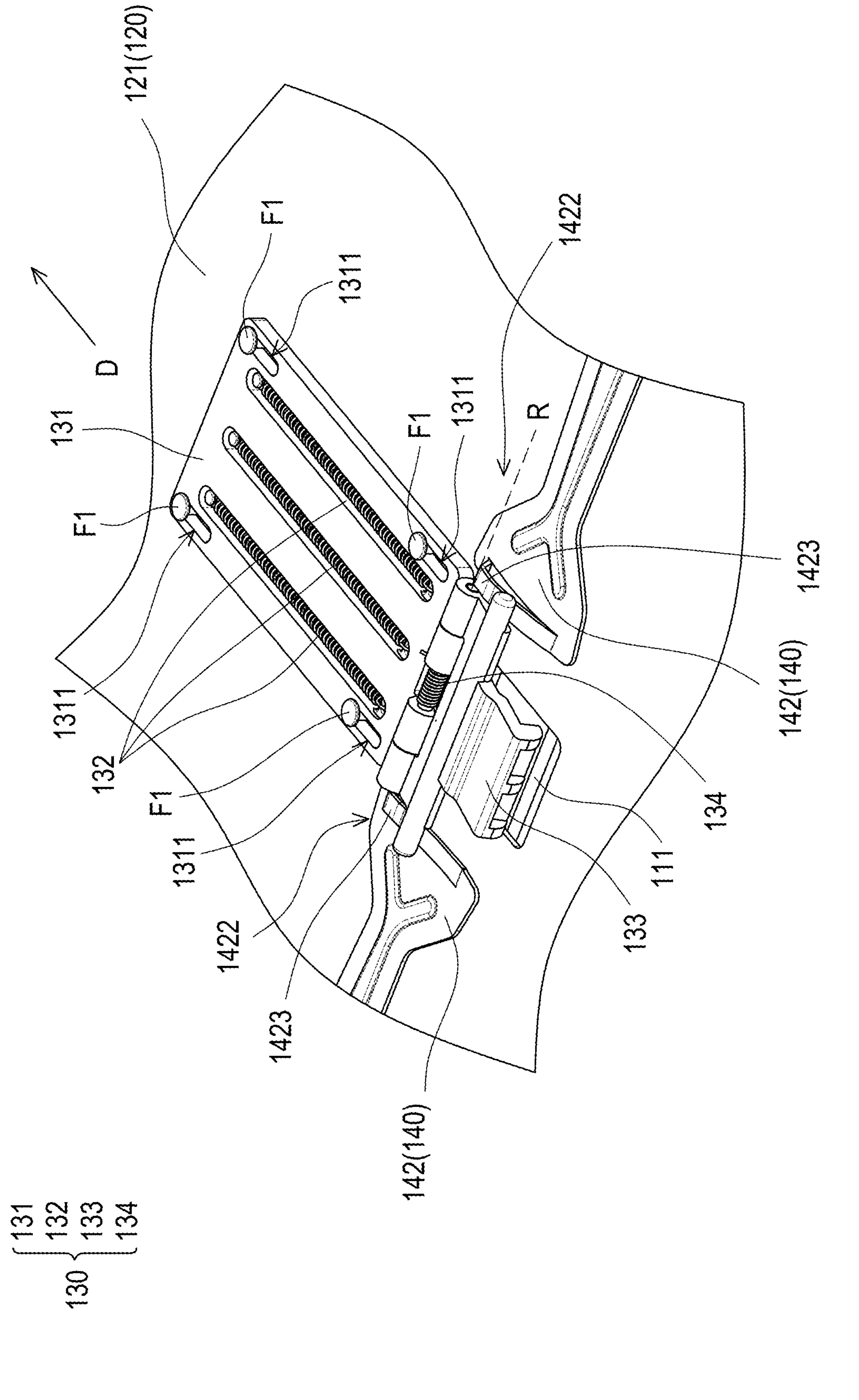
FIG. 10 is a partial enlarged view of a buffering mechanism of FIG. 9.

FIG. 9 shows a handle of FIG. 7 moving and a buffering hook separated from a stopping part. FIG. 10 is a partial enlarged view of a buffering mechanism of FIG. 9. Please refer to FIG. 9 and FIG. 10. When the electronic module 120 is in the first position as shown in FIG. 3 and the user pushes the handle 141 in the sliding direction D, firstly, the protruding post 1411 of the handle 141 slides along the first section 1424*a* of the slide groove 1424 and moves from a position as shown in FIG. 7 to a position as shown in FIG. 9, and in the process, the buffering hook 133 is guided along the rotation axis R as shown in FIG. 10 by the guide slope 1423 and flips upward and then separates from the stopping part 111 (shown in FIG. 10).

Figure 11:
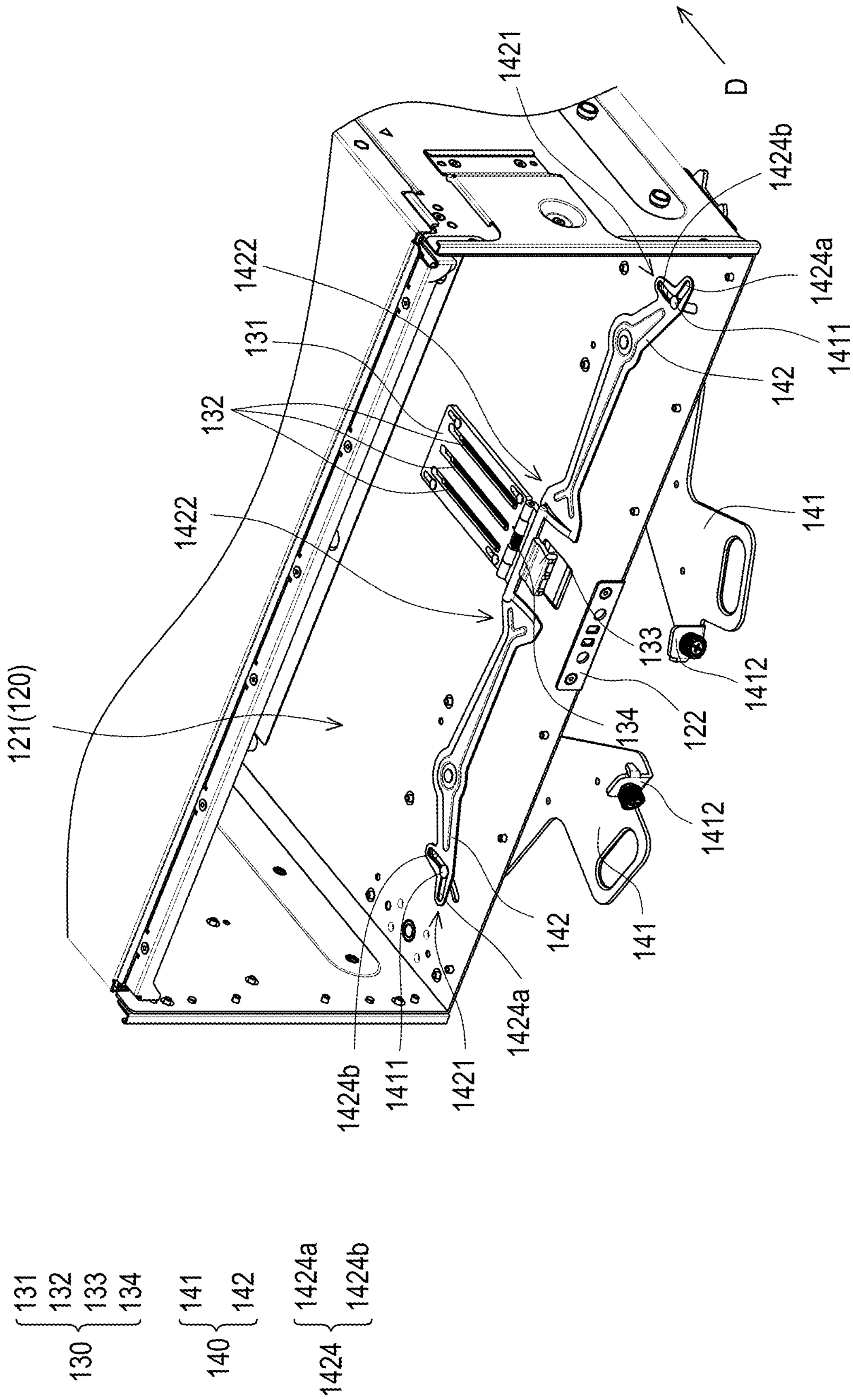
FIG. 11 shows movement of a buffering assembly of FIG. 9.
Figure 12:
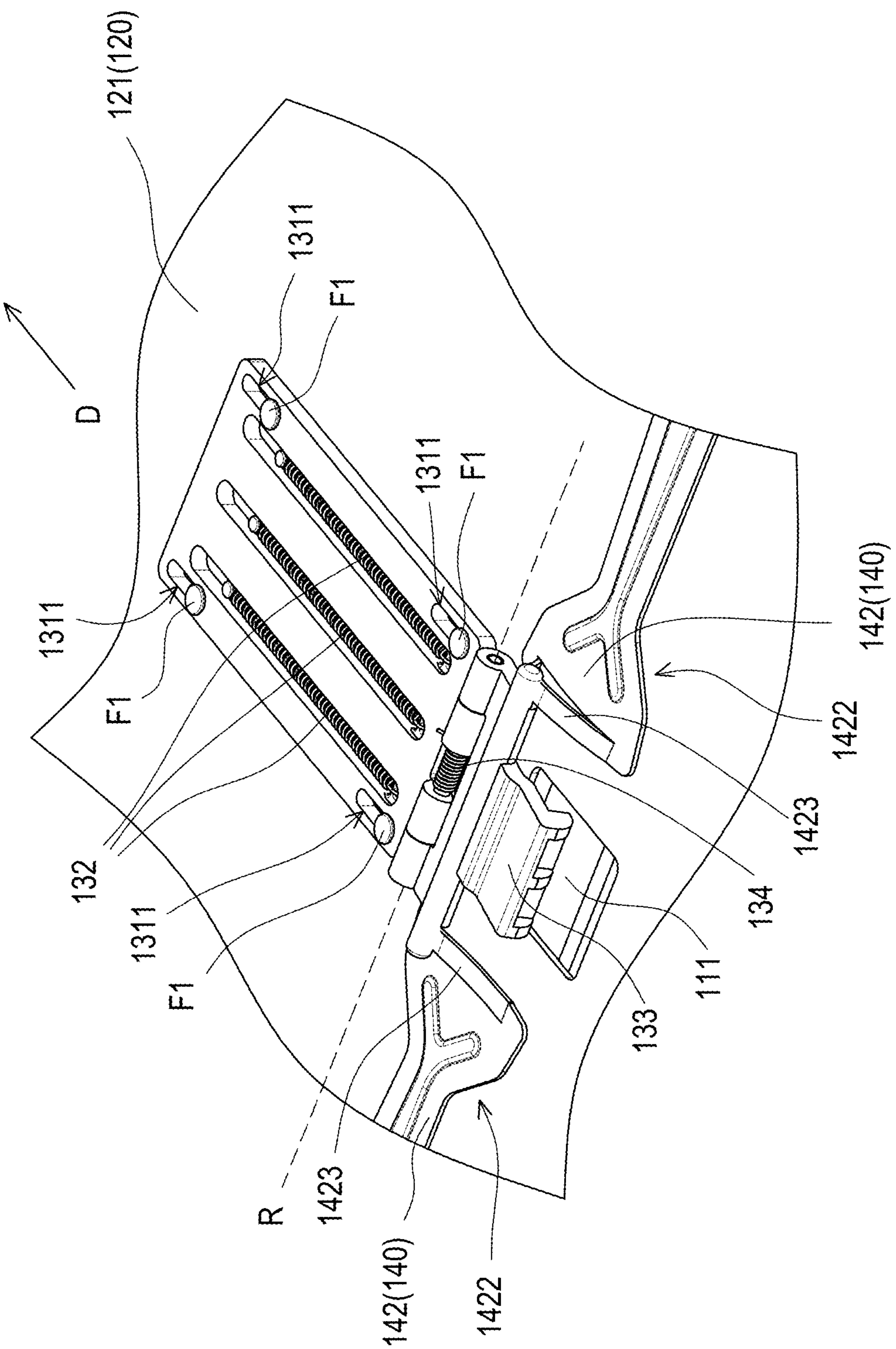
FIG. 12 is a partial enlarged view of a buffering mechanism of FIG. 11.
Figure 13:
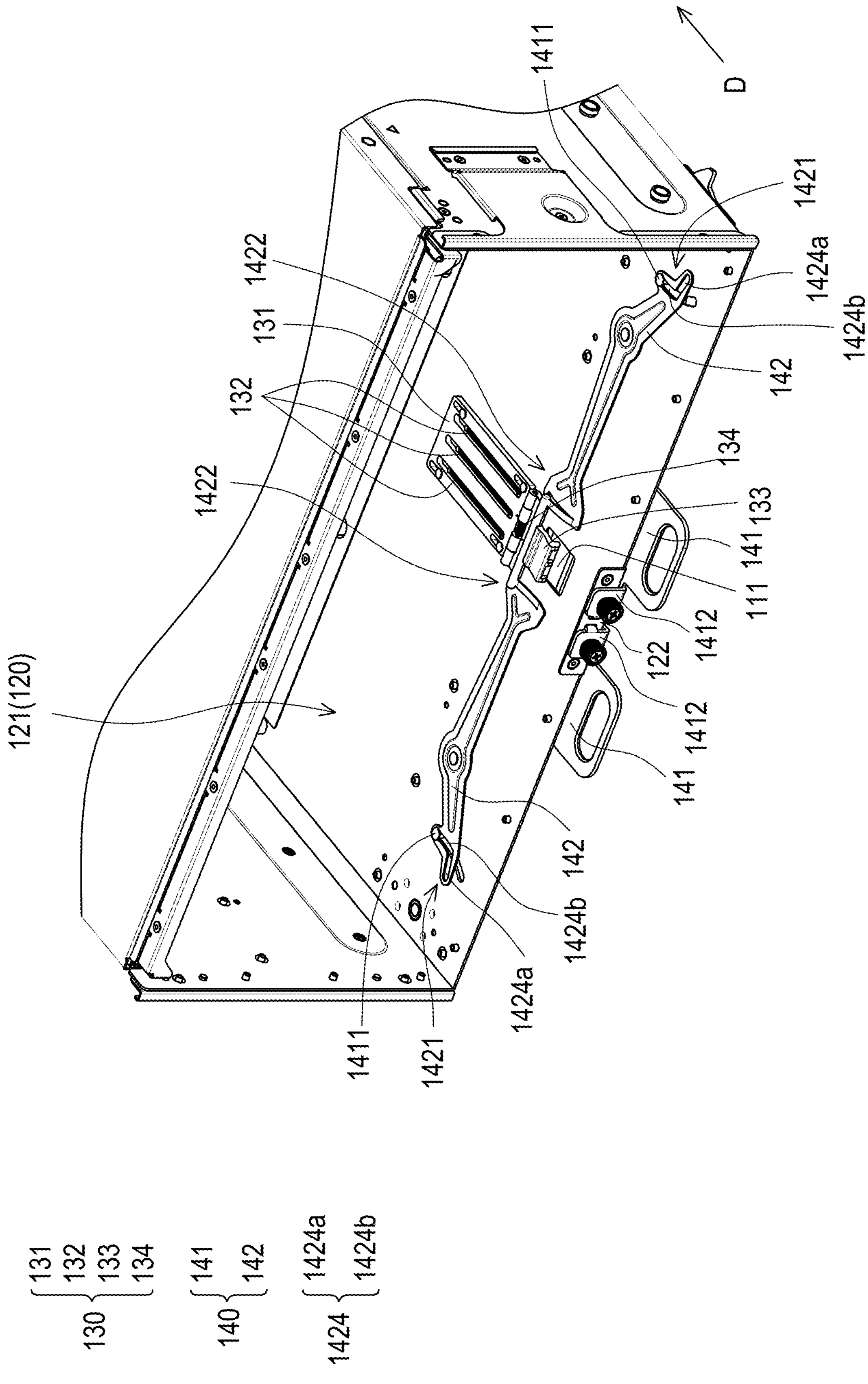
FIG. 13 shows movement of a handle of FIG. 11.

FIG. 11 shows movement of a buffering assembly of FIG. 9. FIG. 12 is a partial enlarged view of a buffering mechanism of FIG. 11. FIG. 13 shows movement of a handle of FIG. 11. Referring to FIG. 11 to FIG. 13, when the buffering hook 133 is separated from the stopping part 111, the buffering member 131 returns to a position shown in FIG. 12 due to the elastic force of the elastic member 132. Then, as the user continues to push the handle 141, the protruding post 1411 of the handle 141 slides along the second section 1424*b* of the slide groove 1424, moving from a position shown in FIG. 9 to a position shown in FIG. 13, and an abutting part 1412 of the handle 141 abuts an abutting structure 122 of the electronic module 120 as shown in FIG. 13. Finally, as the user continues to push the handle 141, the electronic module 120 moves in the sliding direction D from the first position shown in FIG. 3 to the second position shown in FIG. 1, and is plugged in the device body 110. In other words, the user may separate the buffering hook 133 from the stopping part 111 by pushing the handle 141, and may move the electronic module 120 to the second position to be plugged in the device body 110 so that the electronic module 120 may be conveniently installed.

When the user pulls the handle 141 of the electronic device 100 as shown in FIG. 1 in the direction opposite to the sliding direction D so that the electronic module 120 is released from being connected to the device body 110 and moves to the first position as shown in FIG. 3, the guide slope 1423 may return from the position shown in FIG. 13 to the position shown in FIG. 4 with the action of the handle 141, so that the buffering hook 133 of the buffering assembly 130 flips downward accordingly from the position shown in FIG. 13 to the position as shown in FIG. 4 due to the elastic force of the elastic member 134. Accordingly, when the user disposes the electronic module 120 to the device body 110 again in the sliding direction D, the buffering assembly 130 and the handle assembly 140 may smoothly perform the aforementioned action again.

To sum up, in the electronic device disclosed in the disclosure, when the electronic module is installed on the device body, the electronic module slows down and stops at the first position due to mutual stopping of the buffering assembly disposed on the electronic module and the stopping part of the device body, so as to prevent the electronic module and the device body from being damaged due to collision during an installation process. Then, the user may push the handle assembly to release the stopping between the buffering assembly and the stopping part, so that the electronic module may move from the first position to the second position and connect with the device body. In other words, in the process of pushing the handle assembly by the user, the stopping may be released and the electronic module may be connected to the device body, and such an operation mechanism enables the electronic module to be conveniently installed.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:

a device body, having a stopping part;

an electronic module, detachably disposed on the device body in a sliding direction;

a buffering assembly, slidably disposed on the electronic module in the sliding direction, and the stopping part disposed on the buffering assembly on the electronic module; and a handle assembly, pivoted on the electronic module and coupled to the buffering assembly, wherein based on a force applied to the handle assembly in the sliding direction, the buffering assembly is separated from the stopping part, and the electronic module is plugged in the device body.

2. The electronic device according to claim 1, wherein the electronic module has an opening, the stopping part corresponds to the opening, and the buffering assembly is stopped by the stopping part through the opening.

3. The electronic device according to claim 1, wherein the buffering assembly comprises a buffering member and at least one elastic member, the buffering member is slidably disposed on the electronic module in the sliding direction, and the at least one elastic member is connected between the buffering member and the electronic module.

4. The electronic device according to claim 1, wherein the buffering assembly comprises a buffering hook and a buffering member, the buffering member is slidably disposed on the electronic module in the sliding direction, and the buffering hook is pivotally connected to the buffering member and configured to be stopped by the stopping part.

5. The electronic device according to claim 4, wherein the buffering assembly further comprises an elastic member, the elastic member is disposed between the buffering hook and the buffering member, and the buffering hook is maintained at a stop position by an elastic force of the elastic member and is stopped by the stopping part.

6. The electronic device according to claim 1, wherein the handle assembly comprises a handle and a connecting rod, the handle is movably connected to one end of the connecting rod, and the buffering assembly rests on the other end of the connecting rod.

7. The electronic device according to claim 6, wherein the connecting rod has a slide groove, the slide groove comprises a first section and a second section, the first section and the second section extend in different directions respectively, the handle has a protruding post, the protruding post is slidably disposed in the slide groove and is adapted to slide along the first section and the second section in sequence.

8. The electronic device according to claim 6, wherein the connecting rod has a guide slope, and the buffering assembly is separated from the stopping part by guidance of the guide slope.

9. A buffering mechanism, comprising:

a main body;

a buffering assembly, slidably disposed on the main body in a sliding direction;

a stopping part, disposed on the buffering assembly on the main body; and a handle assembly, pivoted on the main body and coupled to the buffering assembly, and the handle assembly having a guide slope;

wherein based on a force applied to the handle assembly in the sliding direction, the buffering assembly is separated from the stopping part by guidance of the guide slope.

10. The buffering mechanism according to claim 9, wherein the main body has an opening, the stopping part corresponds to the opening, and the buffering assembly is stopped by the stopping part through the opening.

11. The buffering mechanism according to claim 9, wherein the buffering assembly comprises a buffering member and at least one elastic member, the buffering member is slidably disposed on the main body in the sliding direction, and the at least one elastic member is connected between the buffering member and the main body.

12. The buffering mechanism according to claim 9, wherein the buffering assembly comprises a buffering hook and a buffering member, the buffering member is slidably disposed on the main body along in the sliding direction, and the buffering hook is pivotally connected to the buffering member and configured to be stopped by the stopping part.

13. The buffering mechanism according to claim 12, wherein the buffering assembly further comprises an elastic member, the elastic member is disposed between the buffering hook and the buffering member, and the buffering hook is maintained at a stop position by an elastic force of the elastic member and is stopped by the stopping part.

14. The buffering mechanism according to claim 9, wherein the handle assembly comprises a handle and a connecting rod, the handle is movably connected to one end of the connecting rod, and the buffering assembly rests on the other end of the connecting rod.

15. The buffering mechanism according to claim 14, wherein the connecting rod has a slide groove, the slide groove comprises a first section and a second section, the first section and the second section extend in different directions respectively, the handle has a protruding post, the protruding post is slidably disposed in the slide groove and is adapted to slide along the first section and the second section in sequence.

16. The buffering mechanism according to claim 14, wherein the connecting rod has the guide slope, and the buffering assembly is separated from the stopping part by guidance of the guide slope.

17. An electronic device, comprising:

a device body, having a stopping part;

an electronic module, detachably disposed on the device body in a sliding direction;

a buffering assembly, slidably disposed on the electronic module in the sliding direction, and the stopping part disposed on the buffering assembly on the electronic module; and a handle assembly, pivoted on the electronic module and coupled to the buffering assembly, the handle assembly having a guide slope, wherein based on a force applied to the handle assembly in the sliding direction, the buffering assembly is separated from the stopping part by guidance of the guide slope.

18. The electronic device according to claim 17, wherein based on a force applied to the handle assembly in the sliding direction, the electronic module is plugged in the device body.

19. The electronic device according to claim 17, wherein the buffering assembly comprises a buffering member and at least one elastic member, the buffering member is slidably disposed on the electronic module in the sliding direction, and the at least one elastic member is connected between the buffering member and the electronic module.

20. The electronic device according to claim 17, wherein the buffering assembly comprises a buffering hook and a buffering member, the buffering member is slidably disposed on the electronic module in the sliding direction, and the buffering hook is pivotally connected to the buffering member and configured to be stopped by the stopping part.

* * * * *